(12) United States Patent
Fairchild et al.

(10) Patent No.: US 6,903,561 B2
(45) Date of Patent: Jun. 7, 2005

(54) CIRCUITRY FOR MEASURING MECHANICAL STRESS IMPRESSED ON A PRINTED CIRCUIT BOARD

(75) Inventors: M. Ray Fairchild, Kokomo, IN (US);
Jiming Zhou, Kokomo, IN (US);
Frank M Stephan, Galveston, IN (US)

(73) Assignee: Delphi Technologies, Inc., Troy, MI (US)

( * ) Notice: Subject to any disclaimer, the term of this patent is extended or adjusted under 35 U.S.C. 154(b) by 121 days.

(21) Appl. No.: 10/408,937

(22) Filed: Apr. 8, 2003

(65) Prior Publication Data

US 2004/0201387 A1 Oct. 14, 2004

(51) Int. Cl.[7] .................. G01R 31/26; G01N 27/04; G01L 1/20; H01C 10/10
(52) U.S. Cl. .................. 324/719; 324/71.1; 73/862.627; 338/47
(58) Field of Search .................. 324/719, 71.1, 324/71.5; 339/47; 73/760, 763, 862.627, 774, 862.045; 361/784, 795; 338/47

(56) References Cited

U.S. PATENT DOCUMENTS

| | | | | |
|---|---|---|---|---|
| 4,261,195 A | * | 4/1981 | Lockery | 73/1.15 |
| 4,380,171 A | * | 4/1983 | Smith | 73/161 |
| 4,555,954 A | * | 12/1985 | Kim | 73/862.046 |
| 4,644,101 A | * | 2/1987 | Jin et al. | 178/18.05 |
| 4,876,120 A | * | 10/1989 | Belke et al. | 428/1.54 |
| 5,122,929 A | | 6/1992 | Palanisamy et al. | 361/760 |
| 5,943,044 A | * | 8/1999 | Martinelli et al. | 345/174 |
| 5,981,883 A | * | 11/1999 | Shriver | 178/18.01 |
| 6,098,464 A | * | 8/2000 | Avisse et al. | 73/708 |
| 6,417,678 B2 | * | 7/2002 | Furukawa | 324/721 |
| 2004/0183648 A1 | * | 9/2004 | Weber et al. | 338/47 |

* cited by examiner

Primary Examiner—Anjan K. Deb
(74) Attorney, Agent, or Firm—Stefan V. Chmielewski

(57) ABSTRACT

A circuit for measuring mechanical stress impressed on a printed circuit board includes a number of electrically conductive pads formed on at least one outer surface of the printed circuit board, and a resistive material applied in a pattern to the printed circuit board and defining a resistor between first and second ones of the number of electrically conductive pads. The resistive material exhibits an electrical resistance that varies as the resistive material is deformed so that the resistor exhibits an electrical resistance value that varies as a function of mechanical stress impressed on the printed circuit board sufficient to deform the resistive material defining the resistor. Any number of such resistors may be formed on or within the printed circuit board, and any such resistor may form part of an external resistor bridge network configured to monitor changes in its resistance value.

20 Claims, 3 Drawing Sheets

US 6,903,561 B2

CIRCUITRY FOR MEASURING MECHANICAL STRESS IMPRESSED ON A PRINTED CIRCUIT BOARD

TECHNICAL FIELD

The present invention relates generally to materials and techniques for measuring mechanical stress and/or strain, and more specifically circuitry for measuring mechanical stress/strain impressed on a printed circuit board.

BACKGROUND OF THE INVENTION

It is generally desirable to minimize mechanical stress and strain impressed on or applied to a printed circuit board during manufacture thereof, during assembly of the printed circuit board into the end product, and throughout the life of the end product. Unfortunately, however, conventional production printed circuit boards typically do not include any mechanism for measuring mechanical stress and/or strain applied thereto. It is accordingly desirable to provide printed circuit boards with circuitry for measuring mechanical stress impressed on or applied thereto so that mechanical stress/strain measurements can be taken before, during and/or after product assembly.

SUMMARY OF THE INVENTION

The present invention comprises one or more of the following features or combinations thereof. A circuit for measuring mechanical stress impressed on a printed circuit board. The circuit may include a number of electrically conductive pads formed on an at least one outer surface of the printed circuit board, and a resistive material applied in a pattern to the printed circuit board to define a first resistor between first and second ones of the number of electrically conductive pads. The resistive material exhibits an electrical resistance that varies as the resistive material is deformed so that the first resistor exhibits a first electrical resistance value that varies as a function of mechanical stress impressed on the printed circuit board sufficient to deform the resistive material defining the first resistor. The printed circuit board may define circuit board mounting locations adjacent to one or more corners thereof for mounting the circuit board to a rigid substrate. The first resistor may be positioned adjacent to a first edge of the printed circuit board, and extend between first and second corners of the printed circuit board.

The first resistor may be configured such that the first electrical resistance value continuously varies as a function of mechanical stress impressed on the printed circuit board sufficient to deform the resistive material defining the first resistor.

The first resistor may alternatively or additionally be configured to open circuit when the mechanical stress impressed on the printed circuit board exceeds a mechanical stress threshold.

The resistive material may further define a second resistor between third and fourth ones of the number of electrically conductive pads, and the second resistor may be positioned adjacent to a second edge of the printed circuit board opposite the first edge and extend between third and fourth corners of the printed circuit board. The second resistor may alternatively be defined between the second one and a third one of the number of electrically conductive pads, with the second resistor positioned adjacent to a second edge of the printed circuit board transverse to the first edge and extending between the second corner and a third corner of the printed circuit board. In either case, the second resistor exhibits a second electrical resistance value that varies as a function of mechanical stress impressed on the printed circuit board sufficient to deform the resistive material defining the second resistor.

The resistive material may further define a third resistor between the second and third ones of the number of electrically conductive pads, and the third resistor may be positioned adjacent to a third edge of the printed circuit board and extend between the second and third corners of the printed circuit board. The third resistor exhibits a third electrical resistance value that varies as a function of mechanical stress impressed on the printed circuit board sufficient to deform the resistive material defining the third resistor.

The resistive material may further define a fourth resistor between the third and fourth ones of the number of electrically conductive pads, and the fourth resistor may be positioned adjacent to a fourth edge of the printed circuit board and extend between the third and fourth corners of the printed circuit board. The fourth resistor exhibits a fourth electrical resistance value that varies as a function of mechanical stress impressed on the printed circuit board sufficient to deform the resistive material defining the fourth resistor.

The first one of the number of electrically conductive pads may alternatively be located substantially central to the printed circuit board and the second one of the number of electrically conductive pads may be located adjacent to a first corner of the printed circuit board, such that the first resistor extends diagonally across the printed circuit board from the first one of the electrically conductive pads to the second one of the number of electrically conductive pads. The second resistor may, in this configuration, extend diagonally across the printed circuit board between the first one of the number of electrically conductive pads and a third one of the number of electrically conductive pads located adjacent to a second corner of the printed circuit board. The third resistor, in this configuration, may extend diagonally across the printed circuit board between the first one of the number of electrically conductive pads and a fourth one of the number of electrically conductive pads located adjacent to a third corner of the printed circuit board. The fourth resistor, in this configuration, may extend diagonally across the printed circuit board between the first one of the number of electrically conductive pads and a fifth one of the number of electrically conductive pads located adjacent to a fourth corner of the printed circuit board.

Alternatively still, the first and second ones of the number of electrically conductive pads may be located adjacent to each other, and the first resistor may extend about a periphery of the printed circuit board.

The printed circuit board includes a top side defining a planar top surface and an opposite bottom side defining a planar bottom surface, wherein the resistive material may be applied in the pattern on the planar top surface of the printed circuit board. Alternatively, the resistive material may be applied in the pattern on the planar bottom surface of the printed circuit board.

The printed circuit board may alternatively or additionally include a number of circuit board layers having electrically conductive patterns disposed between at least some of the number of circuit board layers. The resistive material may be applied in the pattern between a first one of the number of circuit board layers and an opposing second one of the number of circuit board layers to form any number of the resistors.

The circuit may further include a resistor bridge network including a number of resistors, a voltage source supplying a source voltage to the resistor bridge network, and a voltage meter measuring an output voltage across the resistor bridge network, wherein any one of the resistors formed by the resistive material is one of the number of resistors of the resistor bridge network. The output voltage across such a resistor bridge network will vary as the electrical resistance value of the resistor formed by the resistive material varies resulting from mechanical stress impressed on the printed circuit board sufficient to deform the resistive material defining the resistor.

The resistor bridge network may includes first, second, third and fourth resistors all connected in series with the first resistor also connected to the fourth resistor to form the bridge network, and the first resistor of the resistor bridge network may correspond to one of the resistors defined by the resistive material applied in the pattern to the printed circuit board.

The source voltage may be applied across the series combination of the third and fourth resistors, and the voltage meter may be connected across the series combination of the second and third resistors.

These and other features of the present invention will become more apparent from the following description of the illustrative embodiments.

DESCRIPTION OF THE ILLUSTRATIVE EMBODIMENTS

Figure 1:
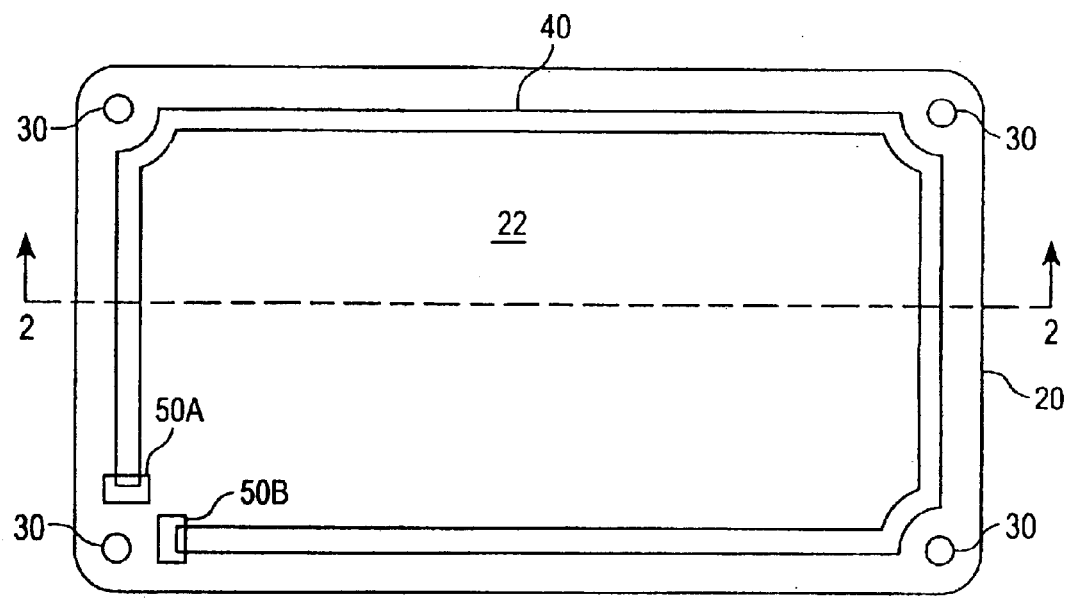
FIG. 1 is a top plan view of a printed circuit board including one embodiment of a circuit for measuring mechanical stress impressed on the circuit board.

Referring now to FIG. 1, a top plan view of a conventional printed circuit board 20 is shown including a mechanical stress sensitive resistor material 40 disposed about a perimeter of the board 20. The circuit board 20 includes a number of through holes 30 each configured to receive a fastening member therein for mounting the circuit board 20 to a suitable substrate, heat sink or other circuit board support member. In the illustrated embodiment, for example, circuit board 20 includes four such through holes 30, each positioned adjacent to a different corner of the generally rectangular-shaped circuit board 20 to serve as circuit board mounting locations. Those skilled in the art will recognize that the circuit board 20 may alternatively be provided in a variety of shapes and configurations, and any number of suitably located through holes 30 may likewise be provided for mounting the circuit board to a support structure. Any such alternative configuration of circuit board 20 and through holes 30 are intended to fall within the scope of the claims appended hereto.

In the embodiment illustrated in FIG. 1, electrically conductive pads 50A and 50B are formed on a top surface 22 of circuit board 20, and both positioned adjacent to one corner of the circuit board 20. In one embodiment, the electrically conductive pads 50A and 50B are formed of a conventional copper (Cu) material of the type typically used to form electrically conductive circuit contacts and circuit paths on conventional printed circuit boards, and are affixed to circuit board 20 via conventional techniques. It is to be understood, however, that the electrically conductive pads 50A and 50B may alternatively be formed of other conductive materials including, for example, but not limited to, other metallic film layers, electrically conductive pastes or other electrically conductive films, or the like, and that any such alternative implementation of the electrically conductive pads 50A and 50B are intended to fall within the scope of the claims appended hereto.

Figure 2A:
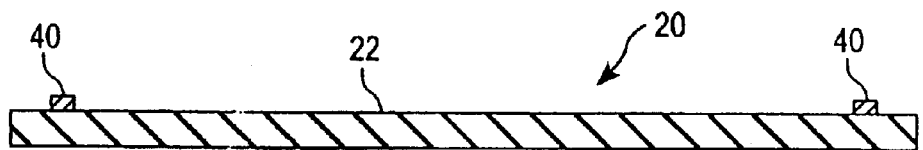
FIG. 2A is a cross-sectional view of the printed circuit board of FIG. 1 viewed along section lines 2—2 and illustrating one desirable location of the resistor material relative to the printed circuit board.

As illustrated in FIGS. 1 and 2A, the mechanical stress or strain sensitive resistor 40 is formed, in one embodiment, on the top surface 22 of the printed circuit board 20, and is disposed in a pattern adjacent to the periphery of the printed circuit board 20, with one end terminating in electrical contact with electrically conductive pad 50A and the opposite end terminating in electrical contact with electrically conductive pad 50B to form a circuit for measuring mechanical stress or strain impressed on the circuit board 20. For purposes of this document, the terms "stress" and "strain", as such terms relate to mechanical force applied to or impressed on the printed circuit board 20 and/or mechanical stress or strain sensitive resistor, may be used interchangeably.

In one embodiment, the mechanical stress sensitive resistor 40 is applied to the circuit board 20 in the form of a paste using known thick film screen printing techniques, and thereafter cured in a conventional manner. It is contemplated, however, that resistor 40 may alternatively be formed on circuit board 20 in varied thicknesses using other conventional processes including, for example, but not limited to, sputtering, attaching via one or more adhesives, or the like. Any such alternative technique for forming resistor 40 is intended to fall within the scope of the claims appended hereto.

The mechanical stress sensitive resistor 40 is formed of a resistive material exhibiting an electrical resistance that varies as the resistive material is deformed relative to its original shape. Resistor 40 accordingly exhibits an electrical resistance value that varies as a function of mechanical stress or strain impressed on the printed circuit board 20 that is sufficient to deform the resistive material defining resistor 40 relative to its original shape. In one embodiment, the resistive material forming resistor 40 is selected to continuously vary as a function to the deformation of resistor 40 relative to its original shape, which is in turn a function of the amount of stress or strain impressed upon the circuit board 20. Such a resistive material may be, for example, a polymer-based paste configured to cure to form a metallic web with direct metallic bonding to pads 50A and 50B and direct metallic bonding between resistive material particles. One formulation of such a resistive material is commercially available through Ormet Corporation of Carlsbad, Calif.

Alternatively or additionally, the resistive material forming resistor 40 may be selected to open circuit upon sufficient deformation of resistor 40 relative to its original shape, which, in turn, corresponds to a threshold amount of stress or strain impressed upon the circuit board 20. In this embodiment, the resistive material forming resistor 40 may be as described above and additionally formulated to open if/when the mechanical stress or strain applied to circuit board 20 exceeds a specified mechanical stress or strain threshold.

Figure 2B:
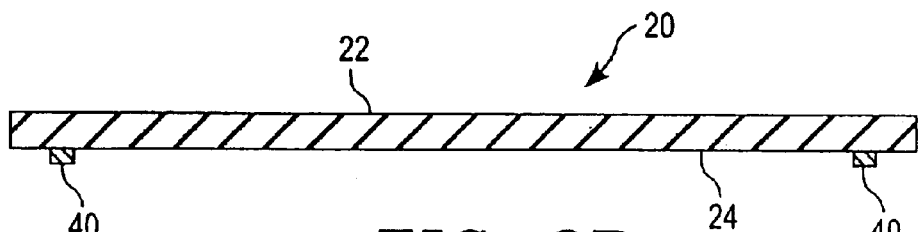
FIG. 2B is a cross-sectional view of the printed circuit board of FIG. 1 viewed along section lines 2—2 and illustrating another desirable location of the resistor material relative to the printed circuit board.
Figure 2C:
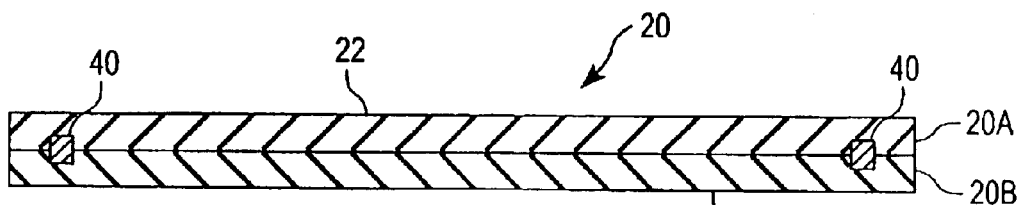
FIG. 2C is a cross-sectional view of the printed circuit board of FIG. 1 viewed along section lines 2—2 and illustrating yet another desirable location of the resistor material relative to the printed circuit board.

Referring now to FIG. 2B, an alternative embodiment is illustrated wherein the resistive material is formed on a bottom surface 24 of the printed circuit board 20. Alternatively still, the printed circuit board 20 may comprise a conventional multilayer circuit board, and one embodiment of such a multilayer circuit board is illustrated in FIG. 2C. The circuit board 20 illustrated in FIG. 2C includes two circuit boards 20A and 20B bonded together in a conventional manner to form a two-layer circuit board. In this embodiment, the resistor 40 is formed between the two circuit board layers 20A and 20B. Those skilled in the art will recognize that the circuit board 20 illustrated in FIG. 2C may include any number of layers, and that the resistor 40 may be disposed between any one or more of the adjacent circuit boards defining the multilayer structure. Any such configuration is intended to fall within the scope of the claims appended hereto.

Figure 3:
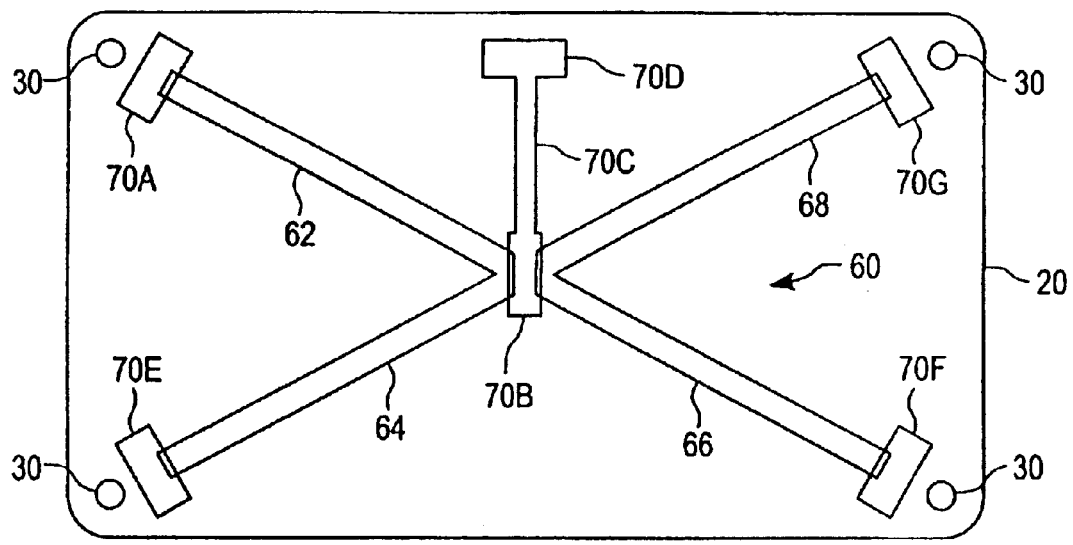
FIG. 3 is a top plan view of a printed circuit board including an alternate embodiment of a circuit for measuring mechanical stress impressed on the circuit board.

Referring now to FIG. 3, the printed circuit board 20 of FIG. 1 is shown including an alternate circuit 60 for measuring mechanical stress impressed on the circuit board 20. In this embodiment, circuit 60 includes a first electrically conductive pad 70B formed centrally on circuit board 20. Pad 70B may be electrically connected to an auxiliary conductive pad 70D via conductor 70C to provide an alternative or additional electrical probe contact. In any case, a second electrically conductive pad 70A is formed adjacent to a first corner of the circuit board 20, and a first resistor 62 extends between and in electrical contact with the conductive pads 70A and 70B. A third electrically conductive pad 70E is formed adjacent to a second corner of the circuit board 20, and a second resistor 64 extends between and in contact with the conductive pads 70A and 70E. A fourth electrically conductive pad 70F is formed adjacent to a third corner of the circuit board 20, and a third resistor 66 extends between and in contact with the conductive pads 70A and 70F. A fifth electrically conductive pad 70G is formed adjacent to a fourth corner of the circuit board 20, and a fourth resistor 68 extends between and in contact with the conductive pads 70A and 70G. Each of the resistors 62, 64, 66 and 68 are formed as described hereinabove with respect to resistor 40, and the circuit 60 is configured such that the resistors 62, 64, 66 and 68 are all arranged diagonally from a different corner of the circuit board 20 toward its center. Those skilled in the art will recognize that any one or more of the resistors 62, 64, 66 and 68 may be formed on any surface of circuit board 20 and/or between layers of a multilayer circuit board, and suitably connected together via known interconnect techniques to form circuit 60.

Figure 4:
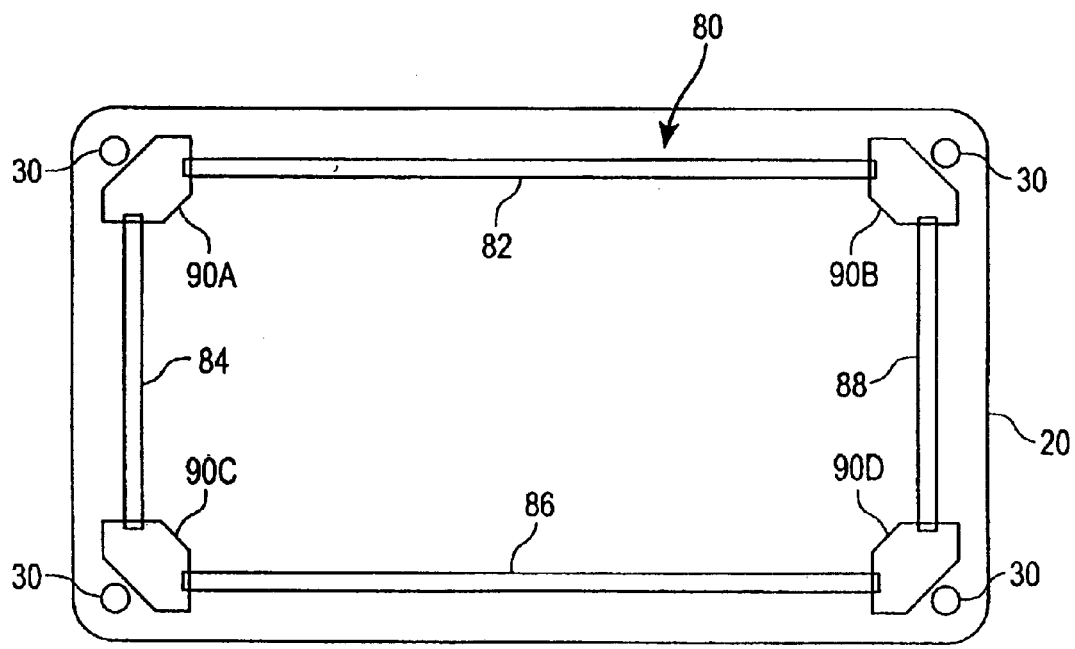
FIG. 4 is a top plan view of a printed circuit board including another alternate embodiment of a circuit for measuring mechanical stress impressed on the circuit board.

Referring now to FIG. 4, the printed circuit board 20 of FIG. 1 is shown including another alternate circuit 80 for measuring mechanical stress impressed on the circuit board 20. In this embodiment, circuit 80 includes a first electrically conductive pad 90A formed adjacent to a first corner of the circuit board 20, and a second electrically conductive pad 90B formed adjacent to a second corner of the circuit board 20. A first resistor 82 extends between and in electrical contact with the conductive pads 90A and 90B along and adjacent to a first side or edge of the circuit board 20. A third electrically conductive pad 90C is formed adjacent to a third corner of the circuit board 20, and a second resistor 84 extends between and in contact with the conductive pads 90A and 90C along and adjacent to a second side or edge of the circuit board 20 generally perpendicular to the first edge or side. A fourth electrically conductive pad 90D is formed adjacent to a fourth corner of the circuit board 20, and a third resistor 86 extends between and in contact with the conductive pads 90C and 90D along and adjacent to a third side or edge of the circuit board 20 generally parallel with the first edge or side. A fourth resistor 88 extends between and in contact with the conductive pads 90B and 90D along and adjacent to a third side or edge of the circuit board 20 generally parallel with the second edge or side. Each of the resistors 82, 84, 86 and 88 are formed as described hereinabove with respect to resistor 40, and the circuit 80 is configured such that the resistors 82, 84, 86 and 88 are all arranged to form individual resistors along each edge or side of the circuit board 20. It is to be understood that circuit 80 may alternatively be provided with any single one or combination of the resistors 82, 84, 86 and 88. Those skilled in the art will recognize that any one or more of the resistors 82, 84, 86 and 88 may be formed on any surface of circuit board 20 and/or between layers of a multilayer circuit board, and suitably connected together via known interconnect techniques to form circuit 80.

Figure 5:
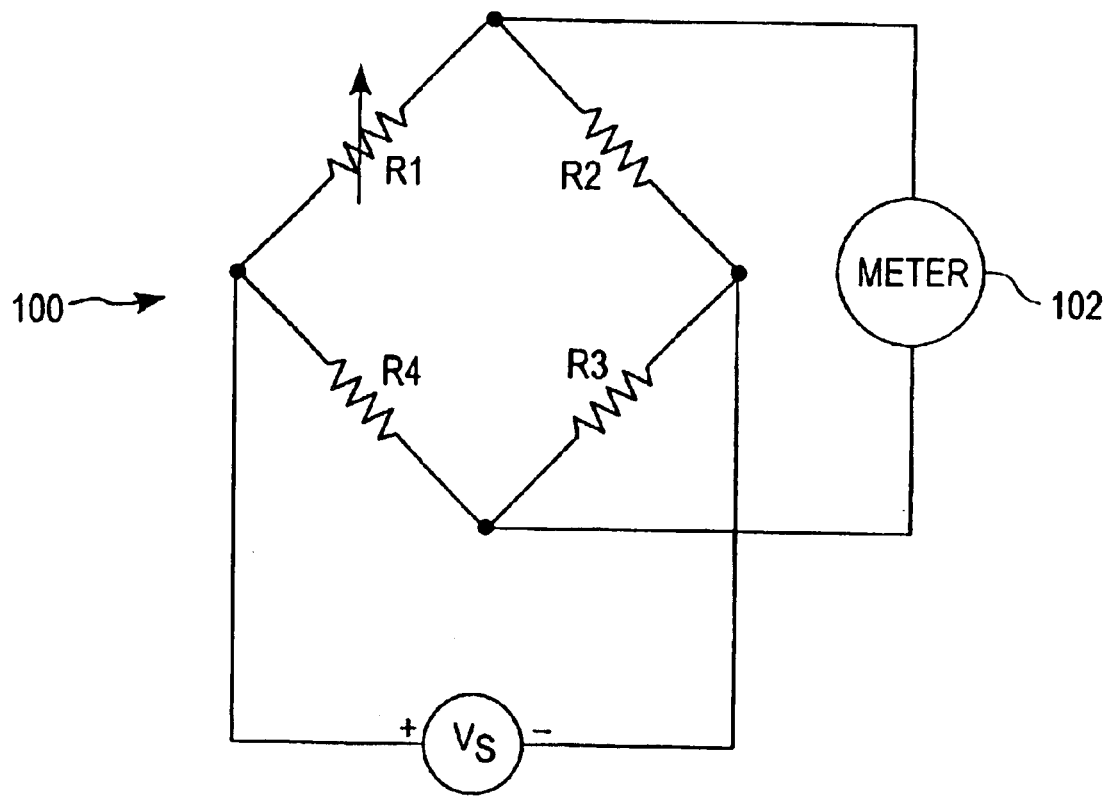
FIG. 5 is a schematic diagram illustrating one embodiment of a circuit for measuring a change in resistance of any one or more of the mechanical stress sensitive resistors illustrated herein.

Referring now to FIG. 5, a schematic diagram is shown illustrating one embodiment of a circuit 100 for measuring a change in resistance of any one or more of the mechanical stress sensitive resistors illustrated herein. In the embodiment shown, circuit 100 includes first, second, third and fourth resistors, R1, R2, R3 and R4 respectively, wherein each of the resistors is series connected in sequence with the free ends of R1 and R4 also connected together to form a resistor bridge. A voltage source, $V_S$ is connected between the common connection of R1 and R4 and the common connection of R2 and R3, and a voltage meter 102 is connected across the common connection of R1 and R2 and the common connection of R3 and R4. In the conventional bridge circuit illustrated in FIG. 5, any one or combination of the mechanical stress sensitive resistors described hereinabove may define resistor R1. In a manner well-known in the art, any changes in resistance of R1 in circuit 100 may then be detected via voltage meter 102.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

What is claimed is:

1. A circuit for measuring mechanical stress impressed on a printed circuit board, the circuit comprising:
   a number of electrically conductive pads formed on an at least one outer surface of the printed circuit board; and
   a resistive material applied in a pattern to the printed circuit board and defining a first resistor between first and second ones of the number of electrically conductive pads, the resistive material exhibiting an electrical resistance that varies as the resistive material is deformed so that the first resistor exhibits a first electrical resistance value that varies as a function of mechanical stress impressed on the printed circuit board sufficient to deform the resistive material defining the first resistor, wherein the first resistor extends along a first edge of the printed circuit board.

2. The circuit of claim 1 wherein the resistive material further defines a second resistor between third and fourth ones of the number of electrically conductive pads, the second resistor extending along a second edge of the printed circuit board opposite the first edge, the second resistor exhibiting a second electrical resistance value that varies as a function of mechanical stress impressed on the printed circuit board sufficient to deform the resistive material defining the second resistor.

3. The circuit of claim 2 wherein the resistive material further defines a third resistor between the second and third ones of the number of electrically conductive pads, the third resistor extending along a third edge of the printed circuit board, the third resistor exhibiting a third electrical resistance value that varies as a function of mechanical stress impressed on the printed circuit board sufficient to deform the resistive material defining the third resistor.

4. The circuit of claim 3 wherein the resistive material further defines a fourth resistor between the third and fourth ones of the number of electrically conductive pads, the fourth resistor extending along a fourth edge of the printed circuit board, the fourth resistor exhibiting a fourth electrical resistance value that varies as a function of mechanical stress impressed on the printed circuit board sufficient to deform the resistive material defining the fourth resistor.

5. The circuit of claim 1 wherein the resistive material further defines a second resistor between the second one and a third one of the number of electrically conductive pads, the second resistor extending along a second edge of the printed circuit board transverse to the first edge, the second resistor exhibiting a second electrical resistance value that varies as a function of mechanical stress impressed on the printed circuit board sufficient to deform the resistive material defining the second resistor.

6. The circuit of claim 1 wherein the first and second ones of the number of electrically conductive pads are located adjacent to each other, and the first resistor extends about a periphery of the printed circuit board.

7. The circuit of claim 1 wherein the first resistor is configured to open circuit when the mechanical stress impressed on the printed circuit board exceeds a mechanical stress threshold.

8. A circuit for measuring mechanical stress impressed on a printed circuit board, the circuit comprising:
   a number of electrically conductive pads formed on an at least one outer surface of the printed circuit board; and
   a resistive material applied in a pattern to the printed circuit board and defining a first resistor between first and second ones of the number of electrically conductive pads, the resistive material exhibiting an electrical resistance that varies as the resistive material is deformed so that the first resistor exhibits a first electrical resistance value that varies as a function of mechanical stress impressed on the printed circuit board sufficient to deform the resistive material defining the first resistor, wherein the first one of the number of electrically conductive pads is located substantially central to the printed circuit board and the second one of the number of electrically conductive pads is located adjacent to a first corner of the printed circuit board, the first resistor extending diagonally across the printed circuit board from the first one of the electrically conductive pads to the second one of the number of electrically conductive pads.

9. The circuit of claim 8 wherein the resistive material defines a second resistor extending diagonally across the printed circuit board between the first one of said number of electrically conductive pads and a third one of the number of electrically conductive pads located adjacent to a second corner of the printed circuit board, the second resistor exhibiting a second electrical resistance value that varies as a function of mechanical stress impressed on the printed circuit board sufficient to deform the resistive material defining the second resistor.

10. The circuit of claim 9 wherein the resistive material defines a third resistor extending diagonally across the printed circuit board between the first one of the number of electrically conductive pads and a fourth one of the number of electrically conductive pads located adjacent to a third corner of the printed circuit board, the third resistor exhibiting a third electrical resistance value that varies as a function of mechanical stress impressed on the printed circuit board sufficient to deform the resistive material defining the third resistor.

11. The circuit of claim 10 wherein the resistive material defines a fourth resistor extending diagonally across the printed circuit board between the first one of the number of electrically conductive pads and a fifth one of the number of electrically conductive pads located adjacent to a fourth corner of the printed circuit board, the fourth resistor exhibiting a fourth electrical resistance value that varies as a function of mechanical stress impressed on the printed circuit board sufficient to deform the resistive material defining the fourth resistor.

12. A circuit for measuring mechanical stress impressed on a printed circuit board, the circuit comprising:
   a number of electrically conductive pads formed on an at least one outer surface of the printed circuit board; and
   a resistive material applied in a pattern to the printed circuit board and defining a first resistor between first and second ones of the number of electrically conductive pads, the resistive material exhibiting an electrical resistance that varies as the resistive material is deformed so that the first resistor exhibits a first electrical resistance value that varies as a function of mechanical stress impressed on the printed circuit board sufficient to deform the resistive material defining the first resistor, wherein the printed circuit board includes a number of circuit board layers having electrically conductive circuit paths disposed between at least some of the number of circuit board layers;
   and wherein the resistive material is applied in the pattern between one of the number of circuit board layers and an opposing one of the number of circuit board layers.

13. The circuit of claim 12 wherein the first resistor extends along first juxtaposed edges of the one of the number of circuit board layers and the opposing one of the number of circuit board layers.

14. The circuit of claim 13 wherein the resistive material further defines a second resistor between third and fourth ones of the number of electrically conductive pads, the second resistor extending along second juxtaposed edges of the one of the number of circuit board layers and the opposing one of the number of circuit board layers edges opposite the first juxtaposed edges, the second resistor exhibiting a second electrical resistance value that varies as a function of mechanical stress impressed on the printed circuit board sufficient to deform the resistive material defining the second resistor.

15. The circuit of claim 14 wherein the resistive material further defines a third resistor between the second and third ones of the number of electrically conductive pads, the third resistor extending along third juxtaposed edges of the one of the number of circuit board layers and the opposing one of the number of circuit board layer, the third resistor exhibiting a third electrical resistance value that varies as a function of mechanical stress impressed on the printed circuit board sufficient to deform the resistive material defining the third resistor.

16. The circuit of claim 15 wherein the resistive material further defines a fourth resistor between the third and fourth ones of the number of electrically conductive pads, the fourth resistor extending along fourth juxtaposed edges of the one of the number of circuit board layers and the opposing one of the number of circuit board layers edges, the fourth resistor exhibiting a fourth electrical resistance value that varies as a function of mechanical stress impressed on the printed circuit board sufficient to deform the resistive material defining the fourth resistor.

17. The circuit of claim 12 wherein the first one of the number of electrically conductive pads is located substantially central to the printed circuit board and the second one of the number of electrically conductive pads is located adjacent to a first corner of the printed circuit board, the first resistor extending diagonally across the one of the number of circuit board layers and the opposing one of the number of circuit board layers between the first one of the electrically conductive pads and the second one of the number of electrically conductive pads.

18. The circuit of claim 17 wherein the resistive material defines a second resistor extending diagonally across the one of the number of circuit board layers and the opposing one of the number of circuit board layers between the first one of said number of electrically conductive pads and a third one of the number of electrically conductive pads located adjacent to a second corner of the printed circuit board, the second resistor exhibiting a second electrical resistance value that varies as a function of mechanical stress impressed on the printed circuit board sufficient to deform the resistive material defining the second resistor.

19. The circuit of claim 18 wherein the resistive material defines a third resistor extending diagonally across the one of the number of circuit board layers and the opposing one of the number of circuit board layers between the first one of the number of electrically conductive pads and a fourth one of the number of electrically conductive pads located adjacent to a third corner of the printed circuit board, the third resistor exhibiting a third electrical resistance value that varies as a function of mechanical stress impressed on the printed circuit board sufficient to deform the resistive material defining the third resistor.

20. The circuit of claim 19 wherein the resistive material defines a fourth resistor extending diagonally across the one of the number of circuit board layers and the opposing one of the number of circuit board layers between the first one of the number of electrically conductive pads and a fifth one of the number of electrically conductive pads located adjacent to a fourth corner of the printed circuit board, the fourth resistor exhibiting a fourth electrical resistance value that varies as a function of mechanical stress impressed on the printed circuit board sufficient to deform the resistive material defining the fourth resistor.

* * * * *